United States Patent [19]

Sleight

[11] 3,954,956

[45] May 4, 1976

[54] TERNARY OXIDES WITH THE CUBIC $KSbO_3$ CRYSTAL STRUCTURE

[75] Inventor: Arthur William Sleight, Wilmington, Del.

[73] Assignee: E. I. Du Pont de Nemours and Company, Wilmington, Del.

[22] Filed: Jan. 31, 1975

[21] Appl. No.: 546,179

Related U.S. Application Data

[63] Continuation-in-part of Ser. No. 424,895, Dec. 14, 1973, abandoned.

[52] U.S. Cl. .................................. 423/593; 252/518; 252/521

[51] Int. Cl.² .......................................... C01G 55/00

[58] Field of Search ............. 423/22, 593; 252/518, 252/521

[56] References Cited

UNITED STATES PATENTS 3,682,840  8/1972  Van Loan ........................... 252/518

3,859,232  1/1975  Bouchard et al. .................. 252/518

OTHER PUBLICATIONS

Donohue et al., "Inorganic Chemistry," Vol. 5, Mar. 1966, pp. 335–338.

Sleight et al., "Inorganic Chemistry," Vol. 1, 1962, pp. 245–250.

McDaniel et al., "Journal of Research, Bureau of Standards," Vol. 75A, 1971, pp. 185–196.

Longo et al., "Materials Research Bull.," Vol. 4, 1969, pp. 191–202.

Primary Examiner—Herbert T. Carter
Attorney, Agent, or Firm—Anthony P. Mentis

[57]     ABSTRACT

Ternary oxides characterized by single phase cubic $KSbO_3$-type crystal structure are electrically conductive and useful as pyrotechnics. $BaIr_2O_6$ is exemplary.

6 Claims, No Drawings

TERNARY OXIDES WITH THE CUBIC KSBO$_3$ CRYSTAL STRUCTURE

RELATED APPLICATION

This application is a continuation-in-part of my copending application Ser. No. 424,895 filed Dec. 14, 1973 and now abandoned.

BACKGROUND OF THE INVENTION

1. Field of the Invention

This invention relates to electrically conductive oxides having a single phase cubic KSbO$_3$-type crystal structure. The KSbO$_3$ structure is readily identifiable by characteristic x-ray reflections and has been described in the art [e.g. P. Spiegelberg, Arkiv Kemi, 14A (5), 1 (1940)].

2. Description of the Prior Art

Some oxides corresponding to the general formulas shown below have frequently been found in the past to have the pyrochlore-type structure. Such pyrochlore structures are characterized by variable compositions expressed by the formulation (Na,Ca)$_2$(Nb,Ti)$_2$(O,F)$_7$ and are well known in the art. While the pyrochlore-type structure is cubic, it is face-centered cubic in contrast to either the primitive or body-centered cubic characteristic of the cubic KSbO$_3$ structure. Additionally, x-ray determinations show the pyrochlore structure to have a lattice constant ($a_0$) greater than 10A whereas the lattice constant for the cubic KSbO$_3$-type structure of the present compositions is considerably less than 10A.

In Journal of Research or National Bureau of Standards 75, 385 (1971), McDaniel and Schneider list 2SrO·3IrO$_2$ as one of the compounds in the Sr-IrO$_2$ phase system in air. It is described as cubic, with the KSbO$_3$ structure, but was not prepared as a single phase, therefore, the exact composition is not known.

SUMMARY OF THE INVENTION

The invention comprises an oxide of cubic KSbO$_3$-related crystal structure selected from the group consisting of BaIr$_2$O$_6$, BaOs$_2$O$_6$, SrIr$_2$O$_6$, SrOs$_2$O$_6$ and SrRu$_2$O$_6$.

In general, the oxides are prepared by grinding together a mixture of the requisite ground oxides and effecting reaction by firing the properly constituted mixture in compacted or uncompacted form in open or sealed tubes. Depending on the nature of the components being reacted, the reaction may be carried out: (1) in sealed, platinum or gold tubes and heated to the desired temperature at 0–3000 atmospheres or even higher pressures in any suitable nonreducing atmosphere, e.g. air or oxgen, (2) in open platinum or silica crucibles in air or oxygen, or (3) in sealed platinum or gold tubes under vacuum. Although vessels of platinum, gold or silica are preferred, open or sealed vessles of other high-melting, inert materials such as "Vycor", alumina and the like may be used.

The oxides of the invention are produced at temperatures in the approximate range 600°–1200°C. Temperatures in the range 700°–1000°C. are preferred. The time of reaction is not critical. Usually the reaction time will be of 8 to 25 hours duration. In the event regrinding and refiring should become necessary to obtain a single phase product, up to 5 days reaction time may be required.

SPECIFIC EMBODIMENTS OF THE INVENTION

The following non-limitative examples serve to illustrate the practice of the invention in which all parts are by weight unless otherwise stated.

Example 1

BaIr$_2$O$_6$ 0.8468 g. BaO$_2$ and 0.5605 g. IrO$_2$ were mixed by grinding in a mortar. These reactants were sealed, together with one ml. of water, in a gold tube which was three-eighths inch in diameter ad 5 inches in length. This tube was heated at 700°C. under 3000 atm. of pressure for 8 hours. The product was black cubic crystals. Chemical and structural analysis showed the formula to be BaIr$_2$O$_6$. The electrical resistivity of a crystal was found to be $3.7 \times 10^{-5}$ ohm-cm at 4.2 K and $8.8 \times 10^{-4}$ ohm-cm at 298 K. The cubic cell edge was 9.4106A, and the structure was of the cubic KSbO$_3$-type.

|  | Ba | Ir | O | Density g/cc |
|---|---|---|---|---|
| Analysis calculated for BaIr$_2$O$_6$: | 22.2 | 62.2 | 15.5 | 7.38 |
| Found: | 22.9 | 61.7 | 15.5 | 7.70 |

Table I

X-Ray Diffraction Data for BaIr$_2$O$_6$

| Reflection h | k | l | d Spacings Observed A | Intensity Observed[1] |
|---|---|---|---|---|
| 1 | 1 | 0 | 6.654 | 35 |
| 2 | 0 | 0 | 4.705 | 25 |
| 2 | 1 | 1 | 3.842 | 30 |
| 2 | 2 | 0 | 3.327 | 5 |
| 3 | 1 | 0 | 2.976 | 100 |
| 2 | 2 | 2 | 2.717 | 10 |
| 3 | 2 | 1 | 2.515 | 60 |
| 4 | 0 | 0 | 2.353 | 5 |
| 3 | 3 | 0 | 2.218 | 20 |
| 4 | 2 | 0 | 2.104 | .5 |
| 3 | 3 | 2 | 2.006 | .5 |
| 4 | 2 | 2 | 1.921 | 15 |
| 4 | 3 | 1 | 1.846 | 35 |
| 5 | 2 | 1 | 1.718 | 5 |
| 4 | 3 | 3 | 1.614 | 15 |
| 4 | 4 | 2 | 1.568 | 45 |

[1]An intensity value of 100 is assigned to the strongest line of the pattern.

Example 2

BaOs$_2$O$_6$ 1.419 g. Ba(OH)$_2$·8H$_2$O, 0.931 g. BaO$_2$, 0.195 g. Na$_2$O$_2$, and 1.111 g. OsO$_2$ were mixed by grinding in a mortar. These reactants were sealed in a gold tube which was three-eighths inch in diameter and 5 inches in length. The tube was heated at 700°C. under 3000 atm. of pressure for 12 hours. The product was black cubic crystals. Chemical analysis could not detect sodium in the product. The electrical resistivity of a single crystal was about two ohm-cm at room temperature.

|  | Ba | Density g/cc |
|---|---|---|
| Analysis calculated for BaOs$_2$O$_6$: | 22.4 | 7.53 |

-continued

| | Ba | Density g/cc |
|---|---|---|
| Found: | 23.7 | 7.37 |

X-ray diffraction analysis run on a different sample showed that the product was of the cubic $KSbO_3$-type with a cell edge of 9.33A. The data are given in Table II.

Table II

X-Ray Diffraction Data for $BaOs_2O_6$

| Intensity Observed | Reflection | | | d Spacings Observed |
|---|---|---|---|---|
| | h | k | l | A |
| $M^+$ | 1 | 1 | 0 | 6.625 |
| $M^-$ | 2 | 0 | 0 | 4.672 |
| M | 2 | 1 | 1 | 3.813 |
| $M^-$ | 2 | 2 | 0 | 3.302 |
| S | 3 | 1 | 0 | 2.952 |
| W | 2 | 2 | 2 | 2.694 |
| S | 3 | 2 | 1 | 2.494 |
| $W^-$ | 4 | 0 | 0 | 2.334 |
| M | 3 | 3 | 0 | 2.199 |
| $W^-$ | 3 | 3 | 2 | 1.989 |
| M | 4 | 2 | 2 | 1.905 |
| S | 5 | 1 | 0 | 1.830 |
| M | 5 | 2 | 1 | 1.704 |
| $W^-$ | 4 | 4 | 0 | 1.650 |
| M | 5 | 3 | 0 | 1.600 |
| $M^-$ | 6 | 0 | 0 | 1.555 |
| W | 6 | 1 | 1 | 1.514 |
| $W^-$ | 6 | 2 | 0 | 1.477 |
| $M^-$ | 5 | 4 | 1 | 1.440 |
| M | 6 | 3 | 1 | 1.376 |
| $W^+$ | 4 | 4 | 4 | 1.347 |
| $W^+$ | 7 | 1 | 0 | 1.320 |

Example 3

$SrRu_2O_6$ 0.5 g. of $SrRuO_3$ powder was mixed with 0.3 g. $KClO_3$ and 0.5 cc. $H_2O$. The mixture was sealed into a gold capsule and fired to 700°C. for 24 hours under 3 kb pressure. Numerous tiny single crystal cubes were formed. X-ray diffraction gave a cubic cell with $a_0 = 9.22A$.

Table III

X-Ray Diffraction for $SrRu_2O_6$

| Intensity Observed | Reflection | | | d Spacings Observed |
|---|---|---|---|---|
| | h | k | l | A |
| $M^+$ | 1 | 1 | 0 | 6.515 |
| M | 2 | 0 | 0 | 4.605 |
| $M^+$ | 2 | 1 | 1 | 3.761 |
| M | 2 | 2 | 0 | 3.257 |
| $S^-$ | 3 | 1 | 0 | 2.914 |
| M | 2 | 2 | 2 | 2.659 |
| S | 3 | 2 | 1 | 2.462 |
| $M^-$ | 4 | 0 | 0 | 2.304 |
| S | 3 | 3 | 0 | 2.173 |
| M | 4 | 2 | 2 | 1.883 |
| S | 5 | 1 | 0 | 1.809 |
| W | 5 | 2 | 1 | 1.684 |
| M | 5 | 3 | 0 | 1.582 |
| $M^+$ | 6 | 0 | 0 | 1.537 |
| M | 6 | 1 | 1 | 1.496 |
| $W^-$ | 6 | 2 | 0 | 1.455 |
| W | 5 | 4 | 1 | 1.421 |
| $M^-$ | 6 | 3 | 1 | 1.360 |
| W | 4 | 4 | 4 | 1.329 |
| $W^+$ | 7 | 1 | 0 | 1.304 |

Example 4

$SrOs_2O_6$ 0.5844 g. $Sr(OH)_2 \cdot 8H_2O$ and 0.4444 g. $OsO_2$ were mixed by grinding in a mortar. These reactants were sealed in a gold tube which was three-eighths inch in diameter and 5 inches in length. The tube was heated at 700°C. under 3000 atm. of pressure for 8 hours. The product was a black powder. X-ray diffraction analysis showed that the product was of the cubic $KSbO_3$-type with $a_0 = 9.20A$.

Table IV

X-Ray Diffraction Data for $SrOs_2O_6$

| Intensity Observed | Reflection | | | d Spacings Observed |
|---|---|---|---|---|
| | h | k | l | A |
| $M^+$ | 1 | 1 | 0 | 6.502 |
| M | 2 | 0 | 0 | 4.603 |
| W | 2 | 1 | 1 | 3.766 |
| M | 2 | 2 | 0 | 3.253 |
| $S^+$ | 3 | 1 | 0 | 2.910 |
| W | 2 | 2 | 2 | 2.657 |
| S | 3 | 2 | 1 | 2.459 |
| $W^+$ | 4 | 0 | 0 | 2.300 |
| $M^-$ | 3 | 3 | 0 | 2.164 |
| W | 4 | 2 | 0 | 2.055 |
| $W^+$ | 4 | 2 | 2 | 1.878 |
| S | 5 | 1 | 0 | 1.805 |
| M | 5 | 2 | 1 | 1.680 |
| M | 5 | 3 | 0 | 1.578 |
| $M^+$ | 6 | 0 | 0 | 1.534 |
| $W^-$ | 6 | 1 | 1 | 1.493 |
| W | 6 | 2 | 0 | 1.455 |
| M | 5 | 4 | 1 | 1.420 |
| M | 6 | 3 | 1 | 1.357 |
| $M^-$ | 4 | 4 | 4 | 1.328 |
| $W^+$ | 7 | 1 | 0 | 1.301 |
| $W^-$ | 7 | 2 | 1 | 1.252 |
| W | 6 | 4 | 2 | 1.230 |

Example 5

$SrIr_2O_6$ 1.4035 g. $SrO_2 \cdot 8H_2O$ and 0.5965 g. $IrO_2$ were mixed by grinding in a mortar. These reactants, along with 1.0 ml. of water, were sealed in a gold tube which was three-eighths inch in diameter and 5 inches in length. The tube was heated at 700°C. under 3000 atm. of pressure for 8 hours. The product was washed with conc. hydrochloric acid and was then a black powder. X-ray diffraction analysis showed that the major phase was of the cubic $KSbO_3$-type with a cell edge of 9.265A.

Table V

X-Ray Diffraction Data for $SrIr_2O_6$

| Intensity Observed | Reflection | | | d Spacings Observed |
|---|---|---|---|---|
| | h | k | l | A |
| M | 1 | 1 | 0 | 6.552 |
| $M^-$ | 2 | 0 | 0 | 4.635 |
| $W^+$ | 2 | 1 | 1 | 3.782 |
| W | 2 | 2 | 0 | 3.277 |
| $S^+$ | 3 | 1 | 0 | 2.932 |
| $S^+$ | 2 | 2 | 2 | 2.676 |
| M | | | | |
| $S^-$ | 3 | 2 | 1 | 2.476 |
| $W^+$ | 4 | 0 | 0 | 2.317 |
| W | 3 | 3 | 0 | 2.184 |
| $W^{--}$ | 4 | 2 | 0 | 2.073 |
| $W^{--}$ | 3 | 3 | 2 | 1.971 |
| $M^+$ | 4 | 2 | 2 | 1.892 |
| $M^{++}$ | 5 | 1 | 0 | 1.818 |
| W | 5 | 2 | 1 | 1.692 |
| $W^{--}$ | 4 | 4 | 0 | 1.634 |
| $M^+$ | 5 | 3 | 0 | 1.590 |
| $M^{++}$ | 6 | 0 | 0 | 1.545 |
| M | 6 | 1 | 1 | 1.504 |
| $W^{++}$ | 6 | 2 | 0 | 1.466 |
| W | 5 | 4 | 1 | 1.430 |
| $W^-$ | 6 | 2 | 2 | 1.396 |
| $M^+$ | 6 | 3 | 1 | 1.366 |
| W | 4 | 4 | 4 | 1.339 |
| $M^-$ | 7 | 1 | 0 | 1.311 |

Table V-continued

X-Ray Diffraction Data for $SrIr_2O_6$

| Intensity Observed | Reflection | | | d Spacings Observed |
|---|---|---|---|---|
| W⁻ | 6 | 4 | 0 | 1.285 |

S-Strong
M-Medium
W-Weak

The compositions of the invention have low electrical resistivities and a combination of properties that particularly adapt them to use in electrical resistors.

In preparing resistors, the compositions may be applied to and bonded to dielectric substrates. The preparation ration typically involves mixing the electrically conducting composition with a finely divided inorganic binder such as a vitreous enamel or glass, and with a liquid or paste vehicle, e.g. water, alcohols, esters, liquid resins and the like, with or without thickeners. There are thus provided mixtures with consistencies suitable for application to solid dielectric substrates.

After application of the coating mixture to the dielectric substrate by conventional means such as spraying, stencilling, screen printing or brushing, the coated dielectric is heated at a temperature sufficient to bond the electrically conductive component, but not so high as to decompose it.

The compositions burn with the production of a definite color. For example $BaIr_2O_6$ produces a green color when heated in a Bunsen flame while the strontium analog produces a crimson color. These properties make the compositions of value in the production of pyrotechnics or fireworks.

The embodiments of the invention in which an exclusive property or privilege is claimed are defined as follows:

1. An oxide of cubic $KSbO_3$ crystal structure selected from the group consisting of $BaIr_2O_6$, $BaOs_2O_6$, $SrIr_2O_6$, $SrOs_2O_6$ and $SrRu_2O_6$.
2. The oxide of claim 1 which is $BaIr_2O_6$.
3. The oxide of claim 1 which is $BaOs_2O_6$.
4. The oxide of claim 1 which is $SrIr_2O_6$.
5. The oxide of claim 1 which is $SrOs_2O_6$.
6. The oxide of claim 1 which is $Sn Ru_2O_6$.

* * * * *

UNITED STATES PATENT OFFICE
CERTIFICATE OF CORRECTION

PATENT NO. : 3,954,956
DATED : May 4, 1976
INVENTOR(S) : Arthur William Sleight

It is certified that error appears in the above-identified patent and that said Letters Patent are hereby corrected as shown below:

In the Title, "KSBO$_3$" should be --KSbO$_3$--.

Column 1, line 1, "KSBO$_3$" should be --KSbO$_3$--.

Column 1, line 40, "or" should be --of--.

Column 5, line 17, delete "ration" (second occurrence).

Column 6, line 23, "SnRu$_2$O$_6$" should be --SrRu$_2$O$_6$--.

Signed and Sealed this
Twenty-sixth Day of April 1977

[SEAL]

Attest:

RUTH C. MASON
*Attesting Officer*

C. MARSHALL DANN
*Commissioner of Patents and Trademarks*